United States Patent [19]
Madrid et al.

[11] Patent Number: 5,532,983
[45] Date of Patent: Jul. 2, 1996

[54] CIRCUIT DESIGN FOR POINT-TO-POINT CHIP FOR HIGH SPEED TESTING

[75] Inventors: Anna Madrid; Scott Jacobson, both of Phoenix; Bidyut K. Bhattacharyya, Chandler, all of Ariz.

[73] Assignee: Intel Corporation, Santa Clara, Calif.

[21] Appl. No.: 998,427

[22] Filed: Dec. 30, 1992

[51] Int. Cl.$^6$ .............................. G04F 8/00; G01R 1/073
[52] U.S. Cl. ..................... 368/113; 324/73.1; 324/710
[58] Field of Search ................................. 368/107–113; 324/73.1, 532, 575, 672, 676, 710, 158 R

[56]  References Cited

U.S. PATENT DOCUMENTS

| | | | |
|---|---|---|---|
| 4,801,871 | 1/1989 | Tada et al. | 324/73 R |
| 4,862,072 | 8/1989 | Harris et al. | 324/73 R |
| 4,928,062 | 5/1990 | Miles et al. | 324/158 R |
| 5,057,783 | 10/1991 | Gubisch | 324/710 |

*Primary Examiner*—Vit W. Miska
*Attorney, Agent, or Firm*—Blakely, Sokoloff, Taylor & Zafman

[57]  ABSTRACT

A test assembly for testing integrated circuits. The assembly includes a test chip that is located between the integrated circuit (IC) and a tester. The test chip has a very low input capacitance that approximates an open circuit, and has an impedance that matches the impedance of the integrated circuit and tester. The matching impedance of the test chip reduces the amount of signal ringing between the integrated circuit and tester.

8 Claims, 4 Drawing Sheets

| OPERATING MODES | | INPUTS | | | | OUTPUTS | | |
|---|---|---|---|---|---|---|---|---|
| | OEC | OET | Ti | MODE | 18 | 20 | 52 |
| TEST MODE | 0 | 0 | 0 | 0 | 0 | 1 | 0 |
| TEST MODE | 0 | 1 | 0 | 0 | 0 | 1 | 0 |
| TEST MODE | 1 | 0 | 0 | 0 | 1 | 0 | 0 |
| TEST MODE | 1 | 1 | 0 | 0 | 1 | 0 | 0 |
| TOTAL LENGTH CALIBRATION (TT) | 1 | 1 | 1 | 1 | 0 | 0 | 1 |
| TOTAL LENGTH CALIBRATION (TT) | 0 | 1 | 1 | 1 | 0 | 0 | 1 |
| INTERNAL PTP CALIBRATION (T2) | 0 | 0 | 1 | 0 | 0 | 1 | 1 |
| INTERNAL PTP CALIBRATION (T2) | 1 | 0 | 1 | 0 | 1 | 1 | 1 |
| INTERNAL PTP CALIBRATION (T2) | 0 | 1 | 1 | 0 | 1 | 0 | 1 |
| INTERNAL PTP CALIBRATION (T2) | 1 | 1 | 1 | 0 | 1 | 0 | 1 |
| TESTER TRANSMISSION LINE CALIBRATION (T1) | 0 | 1 | 0 | 1 | 0 | 0 | 0 |
| TESTER TRANSMISSION LINE CALIBRATION (T1) | 1 | 1 | 0 | 1 | 0 | 0 | 0 |
| ADDITIONAL MODES | 0 | 0 | — | — | — | 1 | 0 |
| ADDITIONAL MODES | 1 | 0 | — | — | — | 1 | 0 |
| ADDITIONAL MODES | 0 | 0 | — | — | — | 1 | 1 |

"0" IMPLIES INPUT VOLTAGE LOW "0" IMPLIES DRIVER 3-STATE
"1" IMPLIES INPUT VOLTAGE HIGH "1" IMPLIES DRIVER IS DRIVING

CIRCUIT DESIGN FOR POINT-TO-POINT CHIP FOR HIGH SPEED TESTING

BACKGROUND OF THE INVENTION

1. FIELD OF THE INVENTION

The present invention relates to a testing system for testing integrated circuits.

2. DESCRIPTION OF RELATED ART

After fabrication, integrated circuits are typically tested to detect defects in the circuits. The circuits are typically inserted into a test system which sends and receives a number of test signals in accordance with a series of test specifications. High speed integrated circuits that are designed to drive a number of devices typically have a relative low output impedance. The chip impedance is frequently much smaller than the impedance of the testing system, creating a impedance mismatch between the two members. The impedance mismatch can cause "ringing" when the digital signals being transmitted change from a high state to a low state, or from a low state to a high state.

Prior attempts to reduce or eliminate signal ringing in a test apparatus include adding a resistor between the chip and the testing system. Adding a resistor dampens the ringing of the signal, but may also introduce undesirable propagation delays in the signal transitions. Additionally, the resistor can reduce the voltage levels of the digital signals. Producing voltage drops in the input/output (I/O) signals is generally undesirable, particularly for high speed chips which typically have low voltage swings.

Another method for dampening signal ringing is to install clamping diodes in the testing system that clamp voltages greater than a predetermined value. To effectively use clamping diodes, the ground noise must be kept to a minimum. Neutralizing the ground noise typically requires the inclusion of additional grounding pins. Because most integrated circuit packages have a fixed pin count, increasing the ground pins would result in a corresponding decrease in the I/O pins of the circuit. Additionally, it is impractical to place clamping diodes on the circuit to control ringing when the testing system is driving the chip. It is therefore desirable to have a testing device which can dampen signal ringing, without increasing the number of pins in the integrated circuit, or introducing excessive voltage drops and propagation delays in the signals.

SUMMARY OF THE INVENTION

The present invention is a test assembly for testing integrated circuits. The assembly includes a test chip that is located between the integrated circuit (IC) and a tester. The test chip has a very low input capacitance that approximates an open circuit, and has an impedance that matches the impedance of the tester and integrated circuit. The matching impedance of the test chip reduces the signal ringing between the integrated circuit and tester.

The test chip isolates the IC and tester, so that the IC can be tested without signal ringing, regardless of the impedance of the tester or IC. The test chip contains a first driver circuit and second driver circuit. The first driver circuit provides an output signal to the tester in response to an input signal from the IC. The second driver circuit provides an output signal to the IC in response to an input signal from the tester. The test chip contains logic for enabling and disabling the driver circuits and determining various propagation delays between the tester and IC.

Therefore it is an object of the present invention to provide a system for testing integrated circuits that does not create ringing in the signals.

It is also an object of the present invention to provide a test chip which will isolate a tester from an integrated circuit.

It is also an object of the present invention to provide a test chip that allows an integrated circuit to be tested by a tester having a different impedance than the IC.

It is also an object of the present invention to provide a test chip that provides individual calibration of each line of a multi-pin integrated circuit.

It is also an object of the present invention to provide a test chip that reduces signal ringing and can be programmed to allow the tester to determine various propagation delays in the system.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 5 is a function table for the test chip.

DETAILED DESCRIPTION OF THE INVENTION

Figure 1:
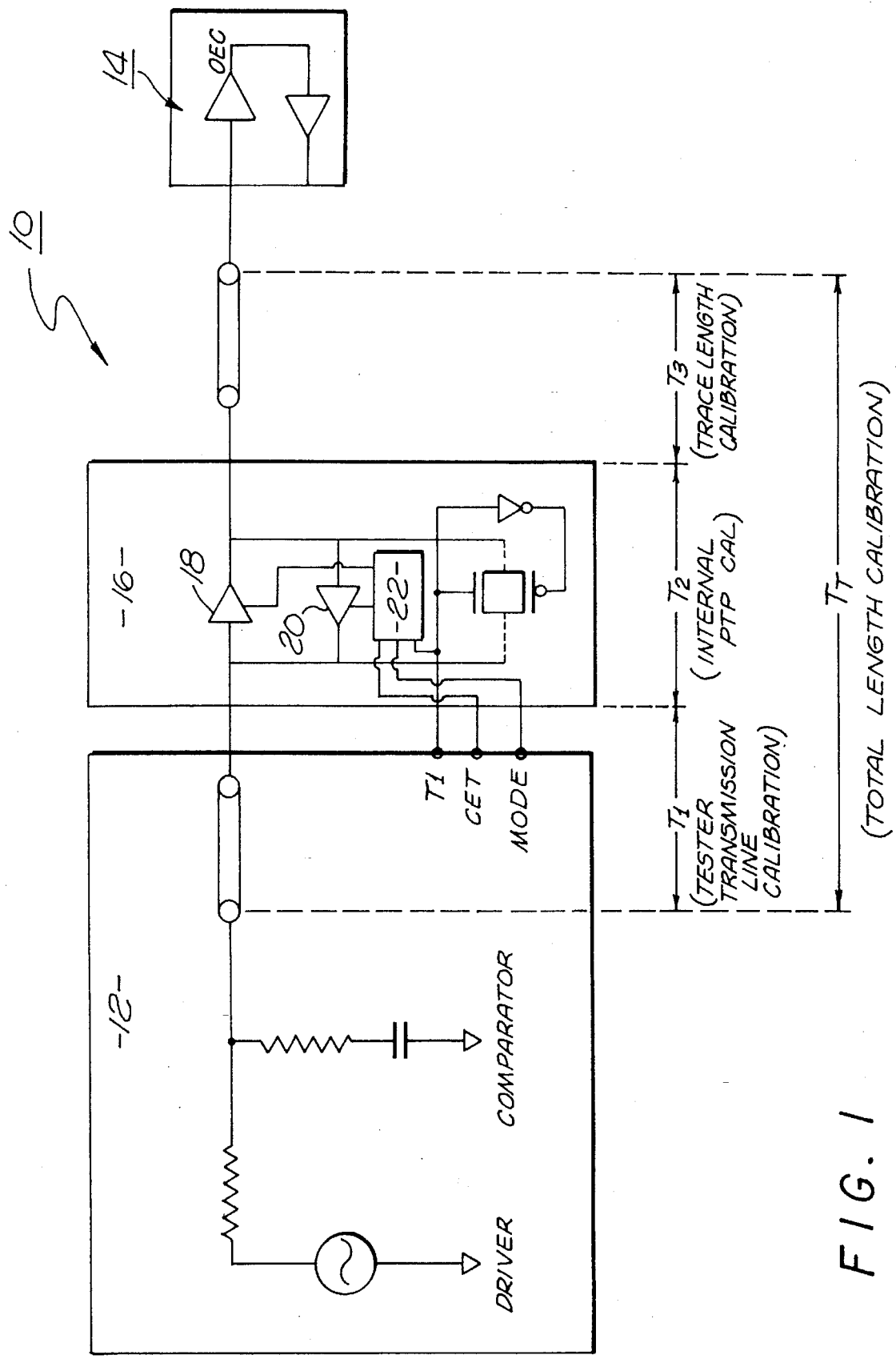
FIG. 1 is a schematic of a test system of the present invention.

Referring to the drawings more particularly by reference numbers, FIG. 1 shows a testing system 10 of the present invention. The testing system 10 includes a tester 12 that test an integrated circuit (IC) 14. The tester 12 typically contains circuits and software that test the IC 14 for defects in either the design or manufacture of the chip. The system 10 also has a test chip 16 located between the tester 12 and the integrated circuit 14.

Figure 2:
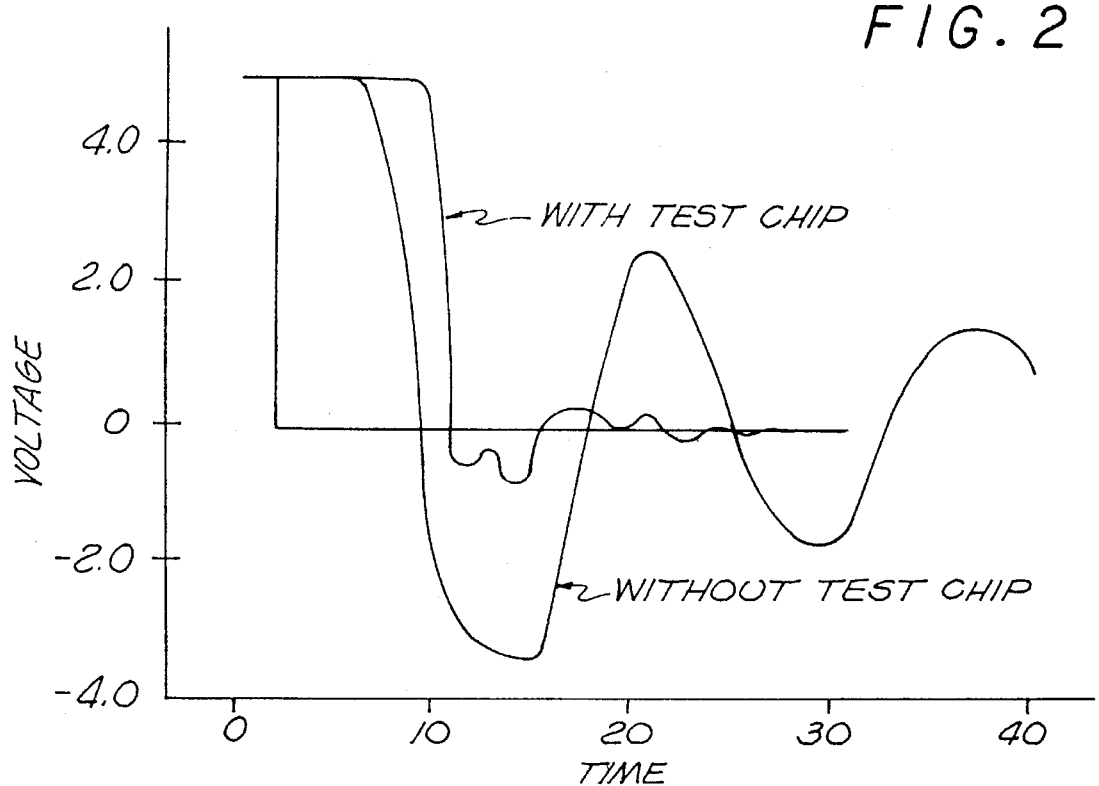
FIG. 2 is a graph showing a digital signal switching from a high state to a low state, with and without the test chip of the present invention.

The integrated circuit 14 may be a high speed microprocessor with internal drivers that are constructed to drive a plurality of external devices. Such high speed processors typically have a low output impedance in the 15 ohm range. Most commercially available testers have an impedance of approximately 50 ohms. Additionally, the transmission lines between the integrated circuit 14 and the tester 12 are typically in the 50 ohm range. As shown in FIG. 2, the impedance mismatch between the integrated circuit 14 and the tester 12 can cause ringing in a signal that makes a transition from high state to a low state (ringing may also occur when the signal switches from a low state to a high state).

The test chip 16 has a capacitance and resulting impedance that is approximately equal to the impedance of either the tester 12 and/or the integrated circuit 14. In the preferred embodiment, the impedance of the test chip 16 is approximately 50 ohms. As shown in FIG. 2, the inclusion of the test chip 16 significantly reduces the ringing of the signal during high to low transitions. The test chip 16 will also dampen ringing when the signal swings from a low state to a high state. The test chip 16 is constructed to dampen ringing when the IC 14 is driving the tester 12, or the tester 12 is driving the IC 14.

Figure 3:
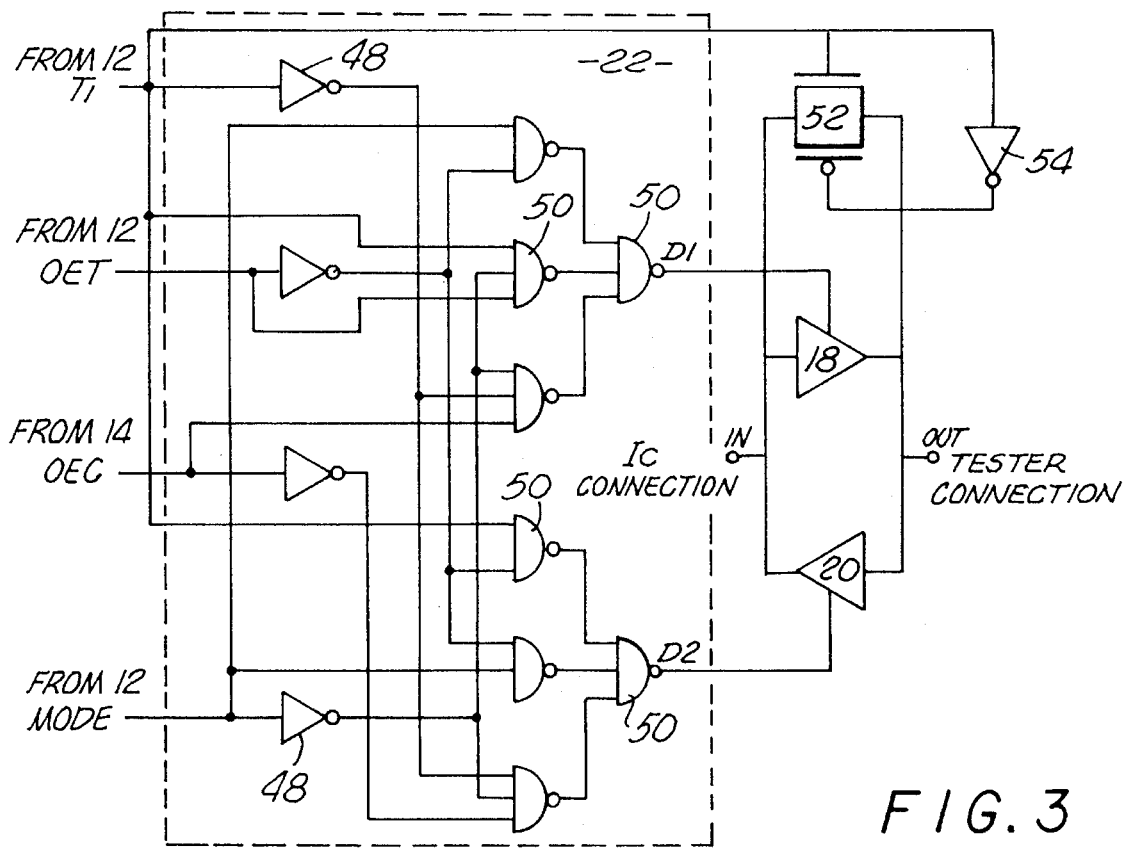
FIG. 3 is a schematic of the test chip.

As shown in FIG. 3, the test chip 16 includes a first driver circuit 18 and a second driver circuit 20. The driver circuits 18 and 20 are enabled or disabled by logic circuit 22. The logic circuit 22 is designed so that the first driver circuit 18 is enabled and the second driver circuit 20 is disabled, when the integrated circuit 14 is sending signals to the tester 12. The logic circuit 22 also enables the second driver 20 and disables the first driver 18, when the tester 12 is driving the integrated circuit 14.

The first driver 18 provides an output signal to the tester 12 in response to an input signal from the integrated circuit 14. Likewise, the second driver 20 provides an output signal to the integrated circuit 14 in response to an input signal from the tester 12. The output signals correlate to the input signals. For example, if the integrated circuit 14 provides a binary 1 to the test chip 16, the test chip 16 will provide a binary 1 output to the tester 12.

Figure 4:
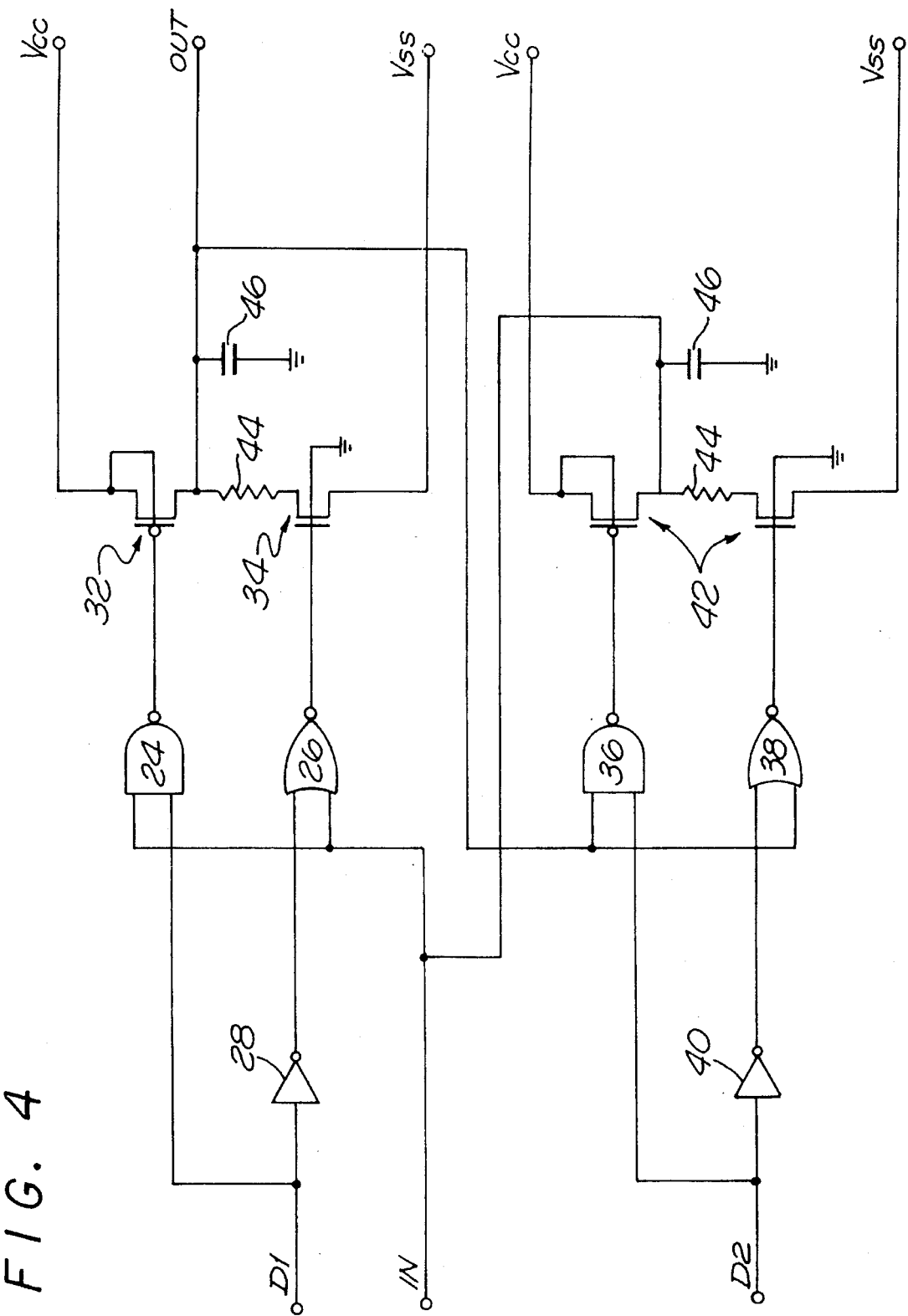
FIG. 4 is a schematic of the driver circuits of the test chip.

FIG. 4 shows a preferred embodiment of the driver circuits 18 and 20. Each driver circuit is similarly constructed. The first driver 18 has an IN pin connected to the integrated circuit 14, an OUT pin connected to the tester 12 and a logic pin designated D1 connected to the logic circuit 22. The IN pin is connected to a NAND gate 24 and a NOR gate 26. The D1 pin is connected to an inverter 28 and the NAND gate 30. The output of the inverter 28 is connected to the NOR gate 26. The output of the NAND gate 24 is connected to a p-channel transistor 32 and the output of the NOR gate 26 is connected to a n-channel transistor 34. The drain pins of the transistors are connected to the OUT pin. The p-channel transistor 32 is connected to VCC and the source pin of the n-channel transistor 34 is connected to VSS.

The first driver 18 is enabled by providing a binary 1 to the D1 pin. If a binary 1 is provided to the IN pin by the integrated circuit 14, both the NAND and NOR gates provide binary 0 outputs to the transistor. The n-channel transistor 34 is turned off and the p-channel transistor pulls the OUT pin high, to provide an output that corresponds to a binary 1. When the integrated circuit 14 switches to a binary 0, the NAND and NOR gates output a binary 1. The p-channel transistor 32 is then turned off and the n-channel transistor 34 drains the OUT pin low, to provide an output that corresponds to a binary 0. The first driver is disabled by providing a binary 0 to type D1 pin.

The second driver 20 has a NAND gate 36 and NOR gate 38 each connected to the OUT pin. The NAND gate 36 is coupled to the logic circuit 22 through a pin designated D2, which is also connected to the NOR gate 38 through an inverter 40. The NAND 36 and NOR 38 gates are connected to a second pair of transistors 42 that have an output connected to the IN pin. The second driver 20 functions like the first driver, wherein the transistors produce an output on the IN pin that corresponds to a signal provided on the OUT pin, when a binary 1 is provided to pin D2. The second driver 20 is disabled by supplying a binary 0 to D2. As shown in FIG. 2, the introduction of transistors between the integrated circuit and tester causes some propagation delay. It has been found that such a delay will not appreciably effect the timing of the circuit 14 or tester 12 if the delay does not exceed 1 ns.

The transistors are constructed to have an impedance that matches the impedance of the tester 12 and integrated circuit 14 so that the test chip does not create ringing when either the integrated circuit 14, or tester 12, send a signal to the chip 16. In the preferred embodiment, each transistor has a gate width of approximately 0.7 microns. Each driver may have a resistor 44 and capacitor 46 that absorb voltage transients introduced to the system. The resistors 44 and capacitors 46 can provide protection from an electrical static discharge (ESD) that is applied to the system.

As shown in FIG. 3, the logic circuit 22 has four different inputs designated T1, OET, OEC and MODE, respectively. The inputs are connected to an array of inverters 48 and NAND gates 50, which provide the outputs on pins D1 and D2. The inputs T1, OET and MODE are provided by the tester 12. The input OEC is generated by the integrated circuit 14. The test chip 16 also includes a pass gate 52 designated TP. The pass gate 52 is connected to the pin T1 through an inverter 54. The pass gate 52 is closed, the gate 52 provides a direct path between the IC 14 and tester 12.

In the preferred embodiment, the test chip 16 complies with the function table shown in FIG. 5. A binary 0 at one of the inputs T1, OEC, OET and MODE indicates a low input voltage. A binary 1 indicates a high input voltage. A binary 0 at the drivers D1 and D2 indicates that the drivers are disabled. A binary 1 indicates that the drivers are enabled. A binary 0 at the pass gate TP indicates that the gate is open. A binary 1 indicates that the pass gate TP is closed, wherein the integrated circuit 14 is directly connected to the tester 12.

When the test chip 16 is in the Test Mode, the tester 12 is testing the integrated circuit 14. The OEC pin is typically used to enable the drivers. For example, when the integrated circuit 14 is to send signals to the tester 12, the circuit 14 provides a binary 1 on the OEC pin. The binary 1 enables the first driver 18 and disables the second driver 20. Likewise, when the tester 12 is to drive the IC 14, the circuit 14 provides a binary 0 on the OEC pin. The other input pins T1, OET and MODE are typically set in a fixed state while the test chip 16 is in the test mode. As an alternative, the tester 12 may set the driver circuit through the OET pin.

It is sometimes desirable to calibrate the testing system. Calibrating the system typically requires determining the propagation delays in the components and transmission lines. The test chip of the present invention is programmable so that the propagation delays; of the test chip 16 (T2), the transmission line between the test chip 16 and tester 12 (T1) and the total delay (TT) between the tester 12 and IC 14 can be computed. As shown in FIG. 5, the total propagation delay between the tester 12 and circuit 14 can be determined by providing the inputs shown for the Total Length Calibration mode. In the Total Length Calibration mode, both drivers are disabled and the pass gate TP is closed so that a signal can be sent directly from the tester 12 to the circuit 14. The length between the two devices can be determined by conventional means such as time domain reflectometry.

The propagation delay between the test chip 16 and tester 12 can be determined by providing the inputs shown in FIG. 5 for the Tester Transmission Line Calibration mode, which disables both drivers 18 and 20 and opens the pass gate TP. The internal delay of the test chip can be computed by providing the inputs shown in FIG. 5 for the Internal PTP Calibration mode. In the Internal PTP Calibration mode, the pass gate TP is closed and the drivers are opened and closed to determine the delay of each driver individually and in combination. The actual internal delay of the test chip 16 can be determined by subtracting the delay of the transmission line T1, from the value found when the test chip is in the Internal PTP Calibration mode. The delay of the trace between the test chip 16 and integrated circuit 14 (T3) can be computed by subtracting the times T1 and T2 from the total time TT, that are indicated in FIG. 1. The test chip 16 also has additional modes reserved for additionally testing or calibration.

Although one set of drivers 18 and 20 are shown, it is to be understood that the integrated circuit 14 and tester 12 may have a plurality of IN and OUT pins, wherein the test chip 16 would contain a number of corresponding drivers. The test chip can be used to individually test each line of the integrated circuit to determine the delays within each line. What is thus provided is a test chip 16 that can be installed into a conventional testing system to reduce signal ringing between the tester 12 and the tested circuit 14. The test chip 16 is also programmable so that the system can be calibrated.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A device that is coupled to a tester with an impedance, that test an integrated circuit with an impedance, comprising:

a test chip that is coupled to and located between the tester and the integrated circuit, said test chip having a first driver circuit that is located between the tester and the integrated circuit and which provides an output test signal to the tester in response to an input test signal from the integrated circuit, and a second driver circuit that is located between the tester and the integrated circuit and which provides an output test signal to the integrated circuit in response to an input test signal from the tester.

2. The device as recited in claim 1, wherein said test chip includes logic circuit means for calibrating a total propagation delay time between the integrated circuit and the tester.

3. The device as recited in claim 2, wherein said test chip includes logic means for calibrating a transmission propagation delay time between the test chip and the tester.

4. The device as recited in claim 3, wherein said test chip includes logic means for calibrating an internal chip propagation delay time of said test chip.

5. A testing assembly, comprising:

an integrated circuit with an impedance;

a tester adapted to test said integrated circuit, said tester having an impedance; and, a test chip that is coupled to and located between said tester and said integrated circuit, said test chip having a first driver circuit that is located between said tester and said integrated circuit and which provides an output test signal to said tester in response to an input test signal from said integrated circuit, and a second driver circuit that is located between said tester and said integrated circuit and which provides an output test signal to said integrated circuit in response to an input test signal from said tester.

6. The assembly as recited in claim 5, wherein said test chip includes logic circuit means for calibrating a total propagation delay time between said integrated circuit and said tester.

7. The assembly as recited in claim 6, wherein said test chip includes logic means for calibrating a transmission propagation delay time between said test chip and said tester.

8. The assembly as recited in claim 7, wherein said test chip includes logic means for calibrating an internal chip propagation delay time of said test chip.

* * * * *